(12) United States Patent
Aik

(10) Patent No.: US 7,571,405 B1
(45) Date of Patent: Aug. 4, 2009

(54) ELECTRICAL DESIGN RULE CHECKING EXPERT TRAVERSER SYSTEM

(75) Inventor: Eric Teh Gim Aik, Sg. Nibong (MY)

(73) Assignee: Altera Corporation, San Jose, CA (US)

( * ) Notice: Subject to any disclaimer, the term of this patent is extended or adjusted under 35 U.S.C. 154(b) by 228 days.

(21) Appl. No.: 11/594,274

(22) Filed: Nov. 7, 2006

Related U.S. Application Data

(62) Division of application No. 10/601,015, filed on Jun. 19, 2003, now Pat. No. 7,162,703.

(51) Int. Cl.
*G06F 17/50* (2006.01)
(52) U.S. Cl. .................................... 716/5; 716/4; 716/6
(58) Field of Classification Search ................. 716/4–6
See application file for complete search history.

(56) References Cited

U.S. PATENT DOCUMENTS

| | | | |
|---|---|---|---|
| 5,050,091 A | 9/1991 | Rubin | |
| 6,002,857 A | 12/1999 | Ramachandran | |
| 6,009,251 A | 12/1999 | Ho et al. | |
| 6,099,582 A | 8/2000 | Haruki | |
| 6,182,020 B1 | 1/2001 | Fairbanks | |
| 6,505,323 B1 | 1/2003 | Lipton et al. | |
| 6,505,327 B2 | 1/2003 | Lin | |
| 6,611,946 B1 | 8/2003 | Richardson et al. | |
| 7,162,703 B1 * | 1/2007 | Aik | 716/5 |
| 7,240,316 B2 * | 7/2007 | Regnier | 716/11 |
| 2005/0132320 A1 * | 6/2005 | Allen et al. | 716/18 |

OTHER PUBLICATIONS

Using Electric 9-2: Design-Rule Checking, http://www.staticfreesoft.com/manual/text/chap09-02.html.
Robert N. Mayo, Magic Tutorial #6: Design-Rule Checking, http://infopad.eecs.berkeley.edu/~icdesign/magic/tut6.html.
Celebrity IC Design and Verification Software, SILVACO International. http://www.silvaco.com/products/legacy/celebrity/celebrity/celebrity.pdf.
CyberCut A Network Manufacturing Service, Design Rule Checking. http://cybercut.berkeley.edu/html/research/project_rule_checker.htm.
Randall et al., Design Rule Checking and Pattern Processing for Advanced MEMS Designs http://www1.zyvex.com/TEXMEMS3/Abstracts/JRandall.html.
P3 Design Rule Checker, Hierarchical and Incremental Design Rule Checker, http://www.phase3.com/p3v-dsnchk.htm.
Pais et al., "Developing a distributed architecture for design rule checking", Aug. 14-17, 2001 IEEE 2001 Midwest Symposium on, vol. 2, pp. 678-681, vol. 2, Digital Object Identifier 10.1109/MWSCAS.2001.986279.

* cited by examiner

*Primary Examiner*—Naum B Levin
(74) *Attorney, Agent, or Firm*—Weaver Austin Villeneuve & Sampson LLP

(57) ABSTRACT

Method and apparatus for rule checking systems that validate an electronic design is disclosed. Generally, information is extracted from a plurality of nodes in a netlist and stored for a set of predefined rules to share in a rule checking engine. The rule checking engine includes a generic routine for executing rules having a simple format. A user or developer may enter new rules in the form of one or more simple conditions that can be matched against any node in an electronic design under consideration. In one embodiment, the rule checking engine considers each node of the design in succession. At any given node, the engine applies all appropriate rules and flags any violation. In some embodiments, rules may require consideration of properties from one or more neighboring nodes. Thus, in some embodiments, the rule checking engine can traverse multiple nodes in order to evaluate a rule.

15 Claims, 7 Drawing Sheets

ELECTRICAL DESIGN RULE CHECKING EXPERT TRAVERSER SYSTEM

CROSS-REFERENCE TO RELATED APPLICATIONS

This application is a divisional of U.S. application Ser. No. 10/601,015 entitled "ELECTRICAL DESIGN RULE CHECKING EXPERT TRAVERSER SYSTEM" filed Jun. 19, 2003, now U.S. Pat. No. 7,162,703, where is hereby incorporated herein by reference.

AUTHORIZATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Generally, this invention pertains to electronic design automation (EDA) rule checking systems. More specifically, the invention pertains to rule checking systems that traverse netlists from node to node and determine whether any rules are violated and thereby validate electronic designs.

A rule-based checking system determines whether an electronic design meets particular design criteria. The rules used in the checking system identify design problems and report them to the user (e.g., designer). Typically, the checking system can identify such problems relatively early in the EDA process, during the design phase, prior to hardware testing. Thus, the rules act on a "high-level" representation such as a netlist or HDL representation, typically before the design has been mapped to hardware. In the case of a netlist, the rules act on the information contained in the individual logic nodes of a netlist and the associated netlist characteristics such as the connectivity between nodes.

Various products are available to perform rule checking on netlists or hardware design language representations of an electronic design. The MaxPlus II EDA software from Altera Corporation (San Jose, Calif.) is one example of a successful product that incorporates a design rule checking system. LEDA from Synopsys of Mountain View, Calif. is another example of a design rule checking system.

Although rule checking systems have proven to be cost effective in identifying and reporting design problems, there are continuing efforts to increase the speed and flexibility of these systems. One persistent issue in rule checking systems is the CPU time required to execute the individual design rules. Generally, each rule is a separate self-contained software function. Thus, the rule includes all logic for moving between the various nodes of a netlist and for extracting the netlist information needed to evaluate the rule. For example, a rule for determining whether all input pins meet particular connectivity requirements, must include not only the logic for making this determination, but also logic for identifying each node to test and logic for extracting the required connectivity information from each node it visits. Unfortunately, each time a rule function encounters a new node, it consumes valuable CPU cycles extracting the information it needs from the node. As a result, common information may be extracted repetitiously over a given set of rules. Therefore, as shown on graph 700 of FIG. 7A, the compilation time increases proportionally with the number of rules executed.

Another persistent issue is the lack of flexibility to easily modify existing rules or enter custom rules. Currently, EDA software vendors often predetermine the set of rules to be used with a rule checking system. Occasionally, EDA software vendors allow the user to enter custom rules. However, the entry is via a scripting format that is difficult to use. As such, a user is often restricted to use only those base rules and has no easy ability to either customize them or enter a new set of rules based on the user's choice.

Further, existing rule checking systems do not adequately support rules that require information from a plurality of logic nodes, particularly information contained in neighboring logic nodes. But as electronic designs become more complex, many logic nodes are systematically linked with one another and therefore contain information that is necessary for determining whether certain other nodes meet particular design criteria. Currently, in order to access this information, existing rule checking systems implement an exhaustive search and loop technique that is time consuming and is susceptible to repeated extractions of the same information in neighboring logic nodes. Hence, rule checking systems cannot efficiently execute moderately complex rules that consider connectivity spanning multiple nodes.

What is needed therefore is an improved rule checking system for EDA software that efficiently checks electronic designs and allows flexible easy entry of new rules as situations warrant.

SUMMARY

The present invention addresses this need by providing an expert system rule checking engine for conducting design rule checking. The rule checking engine includes a generic routine for executing rules having a simple format. A user or developer may enter new rules in the form of one or more simple conditions that can be matched against any node in an electronic design under consideration. The user need not create a separate "function" for each rule. In other words, the user need not create separate instructions for extracting data and/or moving between nodes. Those actions are handled by the rule checking engine. The user or developer need only provide the basic logic of the rule. In operation, the rule checking engine applies each available rule against a node under consideration in order to identify potential violations. If such violations are identified, the engine notifies the user.

In one embodiment, the rule checking engine considers each node of the design in succession. While at any given node, the engine applies all appropriate rules and flags any violation. It then moves to the next node and again applies all appropriate rules. In some embodiments, rules may require consideration of properties from one or more neighboring nodes. For example, a rule may specify that a node under consideration feed a clock node. To evaluate such rule, the rule checking engine will determine whether any of the nodes fed by the node under consideration are actually clock nodes. Thus, in some embodiments, the rule checking engine can traverse multiple nodes in order to evaluate a rule.

Preferably, the rule checking engine possesses generic logic for executing any type of rule, regardless of which particular constraints the rule imposes, including constraints on traversal to neighboring nodes. Thus, the rule checking engine can execute both rules that require traversal and those that do not.

To facilitate rule checking in accordance with this invention, the design rule checking system may operate on cached information about separate nodes of the netlist. The information is provided in an easily accessible location and format so that the rule checking engine consumes minimal CPU cycles when accessing the node information needed for executing individual rules. This represents an improvement over prior design rule checkers, which required the individual design rules to extract required information each time they encountered a new node for evaluation.

Another aspect of the invention pertains to apparatus for performing design rule checking on an electronic design. Such apparatus may be characterized by the following elements: (a) a netlist creator that produces a netlist describing the functional representation of the electronic design across a plurality of nodes; (b) an information extractor that extracts information from the plurality of nodes in the netlist, the information being specific to each node; and (c) a rule checking engine that compares the set of predefined rules to the extracted information of the plurality of nodes in the netlist and that identifies whether any of the predefined rules has been violated by any of the plurality of nodes. The comparing and identifying operations being collectively performed by a common programmable rule checking routine within the rule checking engine, thereby checking the electronic design.

In one embodiment, the apparatus further includes a traverser engine that recognizes whether any of the predefined rules require extracted information from a neighboring node. The traverser engine also determines the neighboring node for comparing under the common programmable rule checking routine whenever any of the predefined rules require extracted information from the neighboring node, the neighboring node being different from the node currently under comparison. Furthermore, the recognizing and determining operations are collectively performed by a common programmable traverser routine within the traverser engine.

In another embodiment, the information extractor extracts information only once for each node in the netlist. The extracted information is dependant on what is required to apply the predefined rules to the plurality of nodes.

In yet another embodiment, the apparatus includes a rule creator for preparing a set of predefined rules. The rule creator can be configured for selecting from at least one hardcoded rule, the hardcoded rule having been predefined without any user intervention. In addition, the rule creator can be configured for receiving at least one hardcoded rule and modifying the hardcoded rule in accordance with user instructions. Generally, the rule creator is configured for receiving the set of predefined rules from a user, and wherein each predefined rule conforms to a single specified format.

An important aspect of the invention pertains to computer program products including machine-readable media on which are provided program instructions and/or arrangements of data for implementing the methods and apparatus described above. Frequently, the program instructions are provided as code for performing certain operations. Data, if employed to implement features of this invention, may be provided as data structures, data objects, or other appropriate arrangements of stored information. Any of the methods or other features of this invention may be represented, in whole or in part, as such program instructions and/or data provided on machine-readable media.

These and other features and advantages of the invention will be presented in more detail below with reference to the associated drawings.

DETAILED DESCRIPTION

Introduction

Figure 1:
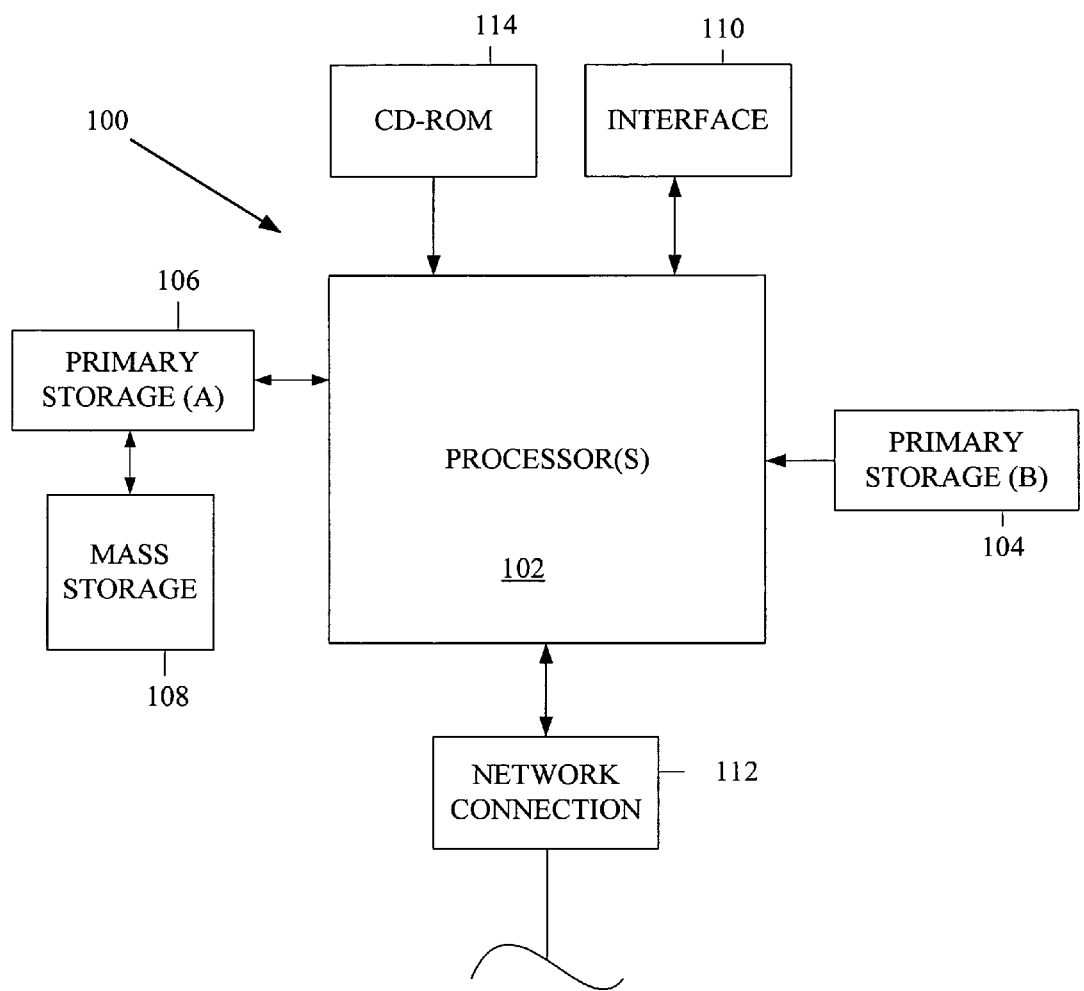
FIG. 1 shows a typical computer system that, when appropriately configured or designed, can serve as an apparatus of this invention.

The present invention will now be described in detail with reference to a preferred embodiment thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

The invention relates to electronic design automation (EDA) rule checking systems that employ "expert" systems for traversing netlists from node to node in order to determine whether any design rules are violated. The expert system applies a predefined rule set to information (e.g., properties) gathered from each node of a netlist or other representation of an electronic design. In this manner, the system validates the electronic design. The information gathered typically includes node properties such as the type of node (e.g., a combinatorial node, a clock node, etc.) as well as connectivity information (fan in and fan out) and port information.

While design rule checking is widely used in the industry, it has not yet been implemented as an expert system with traversing capability. Aspects of this invention provide an expert rule checking system having functionality for executing many different rules imposing many different constraints including constraints on node traversal. Thus, aspects of the invention provide a "generic" rule execution routine and/or a generic node traversal routine. Users and EDA tool developers can employ their own particular sets of rules for design rule checking. In addition, users can easily modify existing rules to produce custom rules suitable for their own needs. The expert design rule checker will execute whichever rules are presented to it.

Generally, the expert rule checking systems of this invention are software programs (or combinations of hardware and software) that use sets of rules to quickly identify errors in an electronic design. In the embodiments described herein, the rule checking system itself performs all or most operations required for rule checking, including, for example, moving from node to node within an electronic design, applying predefined rules to specific nodes it encounters, and reporting rule failures. Typically, a rule checking system of this invention acts on a "knowledge base" that includes the set of rules and/or properties of all nodes in the design. In preferred embodiments, the rule checking engine need not extract the properties from a netlist or other representation. The properties are made available to the engine for each rule that it executes. Thus, neither the rule checking engine nor rules themselves need to include functionality for extracting information from the nodes.

Preferably, all information that will be needed by the available rules is extracted from the netlist or other representation in an operation that is separate from the rule execution operations (as performed by the expert rule checking engine). In one example, an operation preliminary to rule execution extracts all relevant information from each node of a netlist and caches that information for easy access by the rule checking engine in subsequent operations.

As suggested by the examples below, rules used with this invention can specify various types of constraints (e.g., electrical constraints, connectivity constraints, clock constraints, timing closure constraints, reset constraints, signal race constraints, etc.). The choice depends on what types of rules are appropriate for the design in question. Many rules are intended to identify designs that contain a bug or risk of instability (e.g., an unconnected pin, a delay chain in the design, etc.). Frequently, the rules will force the design to conform with the basic principles of synchronous design which will provide predictable, reliable, and portable design results. In many embodiments, the rules can be either "built in" by the EDA software vendor or created by a user. In addition, the user may be able to modify existing rules to customize for his or her purpose.

The design rule checking methods of this invention can be viewed as "static" methods for validating a design. These should be distinguished from dynamic methods such as simulations, which involve "running" a representation of the design to observe data passing through nodes of the design. Further, design rule checking methods of this invention can operate on any level of representation of a design, including gate level netlists and higher level netlists.

Over time, as electronic designs have become increasingly complex, design rule checking systems have correspondingly become more commonly used in the EDA process. The design rule checking systems of this invention can be used in the same context as conventional design rule checking systems. Hence, they can be provided as an integral part of the electronic design automation software. Alternatively, they can be used as stand-alone rule checking systems.

For context, the electronic design automation process may be divided, roughly, into four stages: 1) Design Entry; 2) Design Compilation; 3) Design Verification; 4) Device Programming. The design entry stage normally involves a user (e.g., designer) entering a high level behavioral or functional representation of an electronic design. Design entry by the user may be done using different methods, two of which are a graphical design entry (e.g., schematic design editor) and a text design entry (e.g., hardware description language). In many EDA systems, the output of the design entry stage is a netlist that is derived from the design as entered by the user. Frequently, the netlist is produced from a Hardware Design Language (HDL) representation of the design. Often that representation is provided in a Register Transfer Language (RTL), which specifies some level of hardware design.

Regardless of how the netlist is derived, it may be used for design rule checking in accordance with this invention. After a netlist has been validated using a design rule checking system, it may be compiled to produce a configuration file describing the programming of a hardware device (stage 2). During the design verification stage (stage 3), the design is tested by performing functional and/or timing simulations. It should be noted that the design verification stage may be done at anytime throughout the electronic design process and may go through several iterations before a final electronic design is achieved. Finally, the device programming stage (stage 4) entails programming the hardware device with a final configuration file.

From the above discussion, the meanings of certain relevant terms should be reasonably clear. However, to further illuminate certain concepts pertinent to this invention, the following definitions are provided. These definitions are provided to assist in understanding the concepts presented in the specification. They do not necessarily limit the scope of this invention.

The term "electronic design" generically refers to the logical structure of an electronic device such as an integrated circuit. It may be implemented on hardware (usually referred to herein generically as a "target hardware device"). During the design and development effort, an electronic design may exist in various states or stages. These may include a high level Boolean representation (encoded in a hardware design language for example), a schematic or circuit representation, or any other form representing the logical arrangement of a device. It may include other facets such as floor-plan constraints, wave-form constraints, timing constraints, fitting constraints, etc. At the gate level, it may exist as a netlist (whether synthesized or not) prior to placement on a target hardware device. It may even include completed place and route assignments.

A "netlist" is used to describe the functionality and connectivity of a digital circuit design that can be implemented on a programmable logic device or other target hardware device. The netlist is represented as a hierarchical collection of gates, state machines, high level constructs such as counters or adders, or any other means of defining a collection of outputs based on a collection of inputs. The nodes of the netlist (gates, state machines, etc.) are connected together via nets. Each of these nets is associated with a named digital signal. A netlist may be synthesized to remove redundant logic, simplify the gate layout provided by a user, etc.

When in the form of a netlist (such as a synthesized netlist), an electronic design may be divided into "logic cells" (sometimes called "hardware cells" herein) representing various logic functions within the electronic design. During compilation, these logic cells are mapped onto physical structures known as "logic elements" which reside on the target hardware device. Logic elements may include various types of programmable logic including look up tables (LUTs), product terms, memory blocks, dedicated arithmetic elements such as multipliers and accumulators, etc. The criteria for mapping gates or other design features into logic cells result from the requirement that the resulting logic cell must fit into one logic element. An example of a logic cell is a collection of gates (connected in some way and implemented in a look-up table) combined with a register and configured to implement a multiplexer.

Each node (also sometimes referred to as an "entity" or "atom") includes one or more properties that can be considered during design rule checking. The properties may include node type. An example of a general node type is "combinational" for combinational logic gates. Examples of more specific node types include register, inverter, buffer, AND gate, etc. The properties may also include port type; e.g., port_source. Other properties include connectivity properties such as fan in count and fan out count.

A "compiler" takes a high level representation (e.g., a netlist) as an input, and using a component database puts the information necessary for layout (hardware implementation) and sometimes verification and/or simulation into an object file or files. A design rule checking system checks the input design (netlist or HDL) for design errors, such as multiple outputs connected together, overloaded signal paths, etc. and generates error indications if any such design problems exist. A simulator takes the object file(s) and simulation models, and generates a set of simulation results, acting on instructions, initial conditions, and input signal values provided to it either in the form of a file or user input. When compilation is complete, a target hardware device is programmed (or otherwise constructed) with the compiled design.

In the context of this invention, a target hardware device is any hardware device on which an EDA designed device is implemented. It may include memory elements, registers, and/or dedicated functions such as processor cores and DSP blocks. The logic elements, memory elements, and registers are typically the fundamental elements of the hardware device's architecture on which different electronic design components can be defined. These elements may be grouped into blocks such that each discrete element is associated with a block (or other arbitrary containment entity). There may be higher-level organization in the device such that logic blocks are grouped into rows or some other arbitrary entity.

Target hardware devices may be custom integrated circuits (e.g., ASICs), custom configurations for programmable integrated circuits, or general purpose, mass-produced integrated circuits. Many embodiments of the invention employ programmable devices such as programmable logic devices (PLDs) programmable by a user to produce a custom design for that user. Programmable logic devices are integrated circuits that may be programmed to perform a desired function and include programmable logic arrays (PLAs), programmable array logic (PAL), field programmable gate arrays (FPGAs), complex programmable logic devices (CPLDs), and a wide variety of other logic and memory devices that may be programmed. Altera's Stratix™ devices are examples of PLD target hardware devices. They contain logic elements, memory, and dedicated parallel multiplier circuitry (denoted DSP Blocks).

The "rules" used with this invention can take many forms. Preferably, for any one development platform or rule checking engine, all rules adhere to a simple, standard form. In this manner, the user can create rules suitable for his or her purposes and general purpose logic (in the rule checking engine) can execute each such rule without requiring additional information. Rules generally proscribe certain design features such as features pertaining to node connectivity, electrical connectivity, clocking, timing closure, resetting, and signal racing.

In one specific embodiment, a rule includes one or more sub-rules related by AND. Each sub-rule has at least one basic-rule (i.e., "sub-rule element") that states either a rule or a condition. Further, a logical inversion ("NOT" or "!") can be located at any level of precedence. Thus, the hierarchy of the rule structure can be Rule→Sub-rule→basic-rule (i.e., sub-rule element). In other words, one rule includes one or more sub-rules and a sub-rule can include one or more basic-rules. In many cases, the basic-rules are connected by a Boolean "OR". A basic-rule (sub-rule element) can be a rule or a condition. If the basic-rule is itself a rule, then the overall rule form will be recursive.

As examples consider the following forms of rules and specific rules.

General form of Rule: —
   Sub-rule AND Sub-rule AND Sub-rule . . .

Sub-rule: —
   basic-rule OR basic-rule OR basic-rule . . .

Basic-rule: —
   Rule

Basic-rule: —
   Condition

An example of a sub-rule form employing inversion is the following:

Sub-rule A: —
   !(basic-rule1 OR !basic-rule2 OR basic-rule3)

An example of a recursive rule in which a basic rule is itself a rule is the following:

Rule1: —
   Sub-rule1 AND Sub-rule2.

Sub-rule1: —
   Basic-rule 1.

Sub-rule2: —
   Basic-rule2.

Basic-rule2: —
   !Rule2. (a rule)

Basic-rule2: —
   TYPE !=PIN. (a condition)

Rule2: —(definition of rule2)
   .
   .
   .

The following is a specific example of an electrical rule:

Unconnected input pin: —
   Sub-rule1 AND Sub-rule2.

Sub-rule1: —
   Basic-rule1.

Sub-rule2: —
   Basic-rule2.

Basic-rule1: —
   TYPE==INPUT_PIN.

Basic-rule2: —
   TOTAL_FANOUT==0.

The following is an example of a connectivity rule:

Shorted input pin: —
   Sub-rule1 AND Sub-rule2.

Sub-rule1: —
   Basic-rule1.

Sub-rule2: —
   Basic-rule2.

Basic-rule1: —
   PORT_TOTAL_FANIN>1.

Basic-rule2: —
   PORT_SOURCE_ATOM_TYPE==INPUT_PIN.

The following is an example of a clock rule:

Inverted clock: —
   Sub-rule1 AND Sub-rule2.

Sub-rule1: —
   Basic-rule1.

Sub-rule2: —
   Basic-rule2.

Basic-rule1: —
   TYPE==INVERTER.

Basic-rule2: —
   FANOUT_TO==CLOCK_PORT.

Generally, a rule can be represented with any combination of a single sub-rule, multiple sub-rules, a single sub-rule element, or multiple sub-rule elements together with any number of Boolean operators (e.g., OR, AND, XOR, NAND, NOR, etc.). Furthermore, any logical sequence in the combination of multiple sub-rules or multiple sub-rule elements may be used. For example, a rule can be represented by multiple sub-rules A, B, and C that are combined together in (A AND (B OR C)) as follows:

Rule1: —
   Sub-rule1 AND Sub-rule2.

Sub-rule1: —
   Basic-rule1.

Sub-rule2: —
   Basic-rule2.

Basic-rule1: —
   A.

Basic-rule2: —
   Rule2.

Rule2: —
   Sub-rule3.

Sub-rule3: —
   Basic-rule3 OR Basic-rule4.

Basic-rule3: —
   B.

Basic-rule4: —
   C.

In a preferred embodiment, however, a rule is represented by a single sub-rule or Boolean AND of multiple sub-rules. A violation occurs if all sub-rules are TRUE. In a typical rule, if any of the sub-rules is found to be FALSE, no violation occurs. A sub-rule may be comprised of one or more sub-rule elements (e.g., basic rules). If any one of them is TRUE, the entire sub-rule is deemed to be TRUE (considering that the sub-rule elements are connected by a Boolean OR). This embodiment is used in the pseudo code examples presented below.

Apparatus and Environment

Generally, embodiments of the present invention employ various processes or methods involving data stored in or transferred through one or more computing devices. Embodiments of the present invention also relate to an apparatus for performing these operations. Such apparatus may be specially constructed to serve as a design rule checker of this invention, or it may be a general-purpose computer selectively activated or reconfigured by a computer program and/or data structure stored in the computer. The processes presented herein are not intrinsically related to any particular computer or other apparatus. Various general-purpose machines may be used with programs written in accordance with the teachings herein, or it may be more convenient to construct a more specialized apparatus to perform the required method operations. A particular structure generally representing a variety of these machines will be described below.

In addition, embodiments of the present invention relate to computer readable media or computer program products that include program instructions and/or data (including data structures) for performing various computer-implemented operations. Examples of computer-readable media include, but are not limited to, magnetic media such as hard disks, floppy disks, and magnetic tape; optical media such as CD-ROM disks; magneto-optical media; semiconductor memory devices, and hardware devices that are specially configured to store and perform program instructions, such as read-only memory devices (ROM) and random access memory (RAM). The data and program instructions of this invention may also be embodied on a carrier wave or other transport medium (including electronic or optically conductive pathways).

Examples of program instructions include low-level code, such as that produced by a compiler, as well as higher-level code that may be executed by the computer using an interpreter. Further, the program instructions may be machine code, source code and/or any other code that directly or indirectly controls operation of a computing machine in accordance with this invention. The code may specify input, output, calculations, conditionals, branches, iterative loops, etc.

FIG. 1 illustrates, in simple block format, a typical computer system that, when appropriately configured or designed, can serve as a computational apparatus of this invention. The computer system 100 includes any number of processors 102 (also referred to as central processing units, or CPUs) that are coupled to storage devices including primary storage 106 (typically a random access memory, or RAM), primary storage 104 (typically a read only memory, or ROM). CPU 102 may be of various types including microcontrollers and microprocessors such as programmable devices (e.g., CPLDs and FPGAs) and non-programmable devices such as gate array ASICs or general-purpose microprocessors. In the depicted embodiment, primary storage 104 acts to transfer data and instructions uni-directionally to the CPU and primary storage 106 is used typically to transfer data and instructions in a bi-directional manner. Both of these primary storage devices may include any suitable computer-readable media such as those described above. A mass storage device 108 is also coupled bi-directionally to primary storage 106 and provides additional data storage capacity and may include any of the computer-readable media described above. Mass storage device 108 may be used to store programs, data and the like and is typically a secondary storage medium such as a hard disk. Frequently, such programs, data and the like are temporarily copied to primary memory 106 for execution on CPU 102. It will be appreciated that the information retained within the mass storage device 108, may, in appropriate cases, be incorporated in standard fashion as part of primary storage 104. A specific mass storage device such as a CD-ROM 114 may also pass data uni-directionally to the CPU or primary storage.

CPU 102 is also coupled to an interface 110 that connects to one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 102 optionally may be coupled to an external device such as a database or a computer or telecommunications network using an external connection as shown generally at 112. With such a connection, it is contemplated that the CPU might receive information from the network, or might output information to the network in the course of performing the method steps described herein.

In accordance with this invention, a system such as computer system 100 is used as an electronic design automation tool that provides a system level design interface that facilitates design of test hardware having embedded logic analyzers. Preferably, system 100 also provides system level analysis capabilities and, optionally, one or more of a synthesizer, a compiler, and a target device programmer. Information and programs, including configuration information files and other files can be provided via a network connection 112 for downloading by the designer. Alternatively, such information, programs and files can be provided to a designer on a storage device.

Exemplary Components of an Expert Design Rule System

Figure 2:
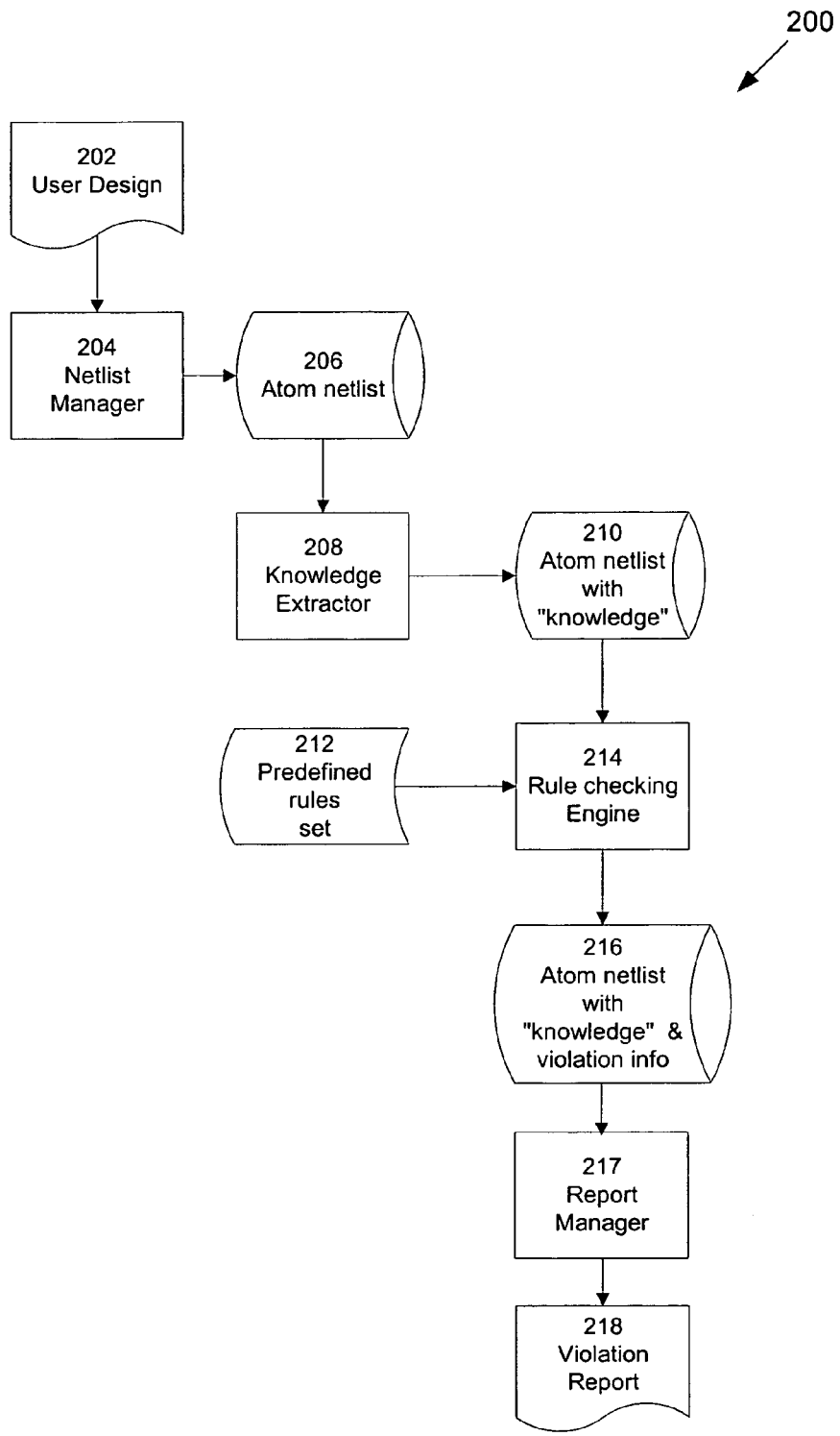
FIG. 2 illustrates a block diagram of a design rule checking system implemented as an expert system according to one embodiment of the present invention.

FIG. 2 presents a block diagram 200 illustrating the components and operation of a design rule checking system implemented as an expert system according to one embodiment of the present invention. To begin with, a user design is provided in block 202. Typically, the user design is a file describing an electronic design, which was entered by a user using EDA design entry tools, although, for purposes of this invention, the design may be provided from any source. As noted earlier, the electronic design may be in the form of a high level Boolean representation (encoded in a hardware design language for example), a schematic or circuit representation optionally including pre-coded circuit blocks, functions, or cores, or any other form representing the logical arrangement of a device. Next, a conversion process is performed on the user design by a netlist manager 204, which may form part of an EDA system. Netlist manager 204 converts features of user design 202 to a netlist suitable for use with the present invention. The conversion may be carried out by a number of available tools. Processes of converting an HDL representation of a design to a netlist are well-known. As shown, netlist manager 204 generates an atom netlist 206, which is made available for information extraction.

An information extractor 208 (also referred to as a "Knowledge Extractor") extracts relevant information such as node properties for any particular node in the netlist. The knowledge extractor serves as a component of (or a service to) the design rule checking system. As shown, information extractor 208 takes atom netlist 206 as input and generates an atom netlist with "knowledge" (210) as output. Generally, information extractor 208 is configurable to accept any type of netlist (such as RTL netlist, gate level netlist, and etc.) as an input for the extraction.

The extracted information ("knowledge") can be used for comparing against any and all members of a set of predefined rules during design rule checking. The extraction is performed for each of a plurality of nodes. In many cases, all or most nodes in a netlist have pertinent information to be extracted. However, each node may contain varying amounts of information to be extracted. The amount of such information to be extracted can be determined and controlled. In one approach, information extractor 208 extracts all information required by all predefined rules, regardless of whether every predefined rule will be used or not. Another method involves extracting only the information as required by the predefined rules that are enabled by the user. Generally, the user can enable or disable any rule in the design rule checking system that will be used in validating the electronic design.

Figure 7A:
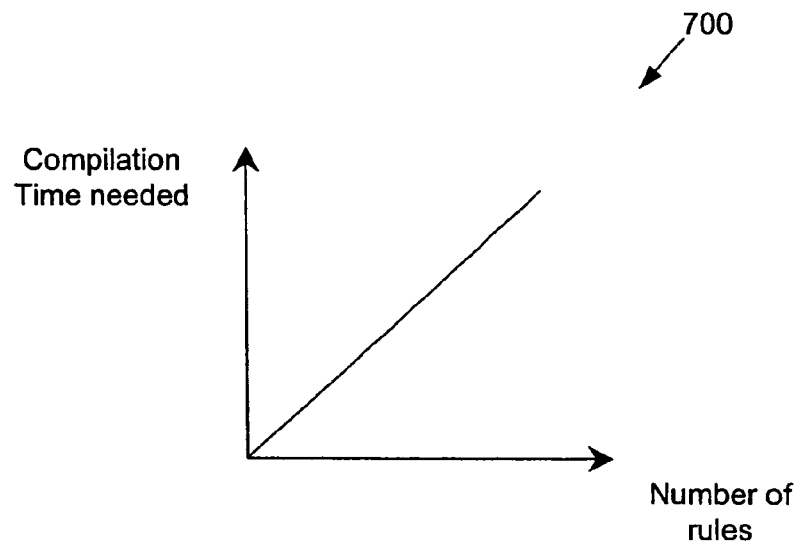
FIG. 7A illustrates a graph plotting compilation time needed versus number of rules for a typical rule checking engine.
Figure 7B:
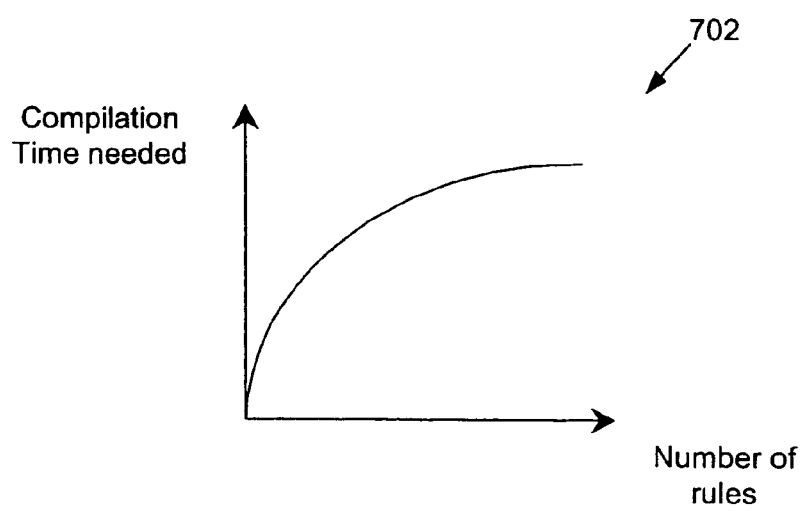
FIG. 7B illustrates a graph plotting compilation time needed versus number of rules for an expert rule checking engine according to one embodiment of the present invention.

According to a preferred embodiment, the extraction by the information extractor is performed only once for any particular node. The extracted information is stored (e.g., cached in memory) in a particular format constructed by information extractor 208. As depicted in block 210, the extracted knowledge is associated with a netlist and identified as a "netlist with knowledge." Typically, the extraction can be completed in one continuous operation across a plurality of nodes in the netlist, but it can also be completed incrementally over several operations to permit the storing of extracted information during the time between each extraction operation. The extracted information, as provided in the "netlist with knowledge" is made available to and shared amongst the set of predefined rules. That is, any predefined rule can have access to the extracted information of any particular node in the netlist. Hence, neither the rule nor the rule checking engine needs to extract the information during execution of the rule. As a result, the time required to execute a set of predefined rules and thereby determine whether any rules are violated is significantly reduced. As can been seen on graph 702 of FIG. 7B, the reduction becomes increasingly apparent as the number of predefined rules increases.

To understand the advantages of using an information extractor implemented in accordance with this aspect of the invention, a comparison with the execution of conventional predefined rules is in order. Generally, conventional predefined rules are configured such that they are individually and fully supported, and there is no sharing of the extracted information between them. Thus, each rule must be provided as a separate software function or routine. Each such rule requires its own extraction routine (or ability to call an extraction subroutine) to extract the necessary information from the netlist. This routine is performed whenever the rule is executed. Therefore, whenever multiple conventional predefined rules require the same information from the same node, multiple extraction processes are executed. Consequently, the rule checking process performs redundant operations and requires multiple instances of extraction source code (one for each conventional predefined rule). Alternatively, the rule checking system may employ a separate programmable function that is repeatedly called (once by each of the conventional predefined rules). Since each extraction process may consume significant computer resources, the time required for design rule checking increases proportionally with the number of rules executed.

In order to overcome these problems and make the extracted information available for all the predefined rules to share, the present invention may employ an information extractor (as described) to construct and output a netlist with "knowledge", as shown in block 210. Many different methods for storing the extracted information can be used. However, the information extractor associates each node in the netlist with its own corresponding extracted information (e.g., atom type, connection port type, total fan-in, total fan-out, etc.); this comprises a netlist with "knowledge." The netlist with "knowledge" may have any format suitable for easy maintenance and access. For example, each node can have associated with it an attribute list where each attribute is arranged with the following structure:

typedef struct

{ attribute type; //e.g., integer, Boolean, etc. (by using enum)
    attribute value list; //This will allow multiple values for the same attribute}ATTR_VALUE_STRUCT;

typedef struct
{
    attribute name; //by using enum such as ATOM_TYPE, TOTAL_FANOUT, etc
    ATTR_VALUE_STRUCT val;
}

In a preferred embodiment, the netlist with "knowledge" will be configured in a generic format for storing the extracted information. For instance, the netlist with "knowledge" can contain a list of void pointers to allow the receipt and the retention of different types of data such as integer, Boolean, etc.

Block 212 represents a predefined rules set. The predefined rules set may include rules that are "built in" (e.g., hardcoded) by the EDA software vendor and/or created by a user or third party. Note that the rules set may include modified versions of existing rules that have been customized by the user to fine tune for his or her purposes. The predefined rules set may include rules (or algorithms or conditions) that comprise the sub-rules of the rule as described above. They are available for applying against the extracted information, typically via a rule checking engine of the type described above. Furthermore, the predefined rules may be enabled for use in validating the electronic design either by the user or by the design rule checking system. Thus, in some embodiments, the user may select particular rules from among a set of available rules for execution.

Although the predefined rules may be provided in multiple formats, a preferred embodiment implements a format that is generic and simple to all the predefined rules. For example, a user simply needs to enter the rule followed by any corresponding sub-rules and sub-rule elements as illustrated below in the pseudo code for a gated clock rule:

Gated_clock: —
    Type (combinatorial)
    Fanout (clock port)

Specifically, "Gated_clock" identifies the rule itself by name, "Type" and "Fanout" each identify a corresponding sub-rule, and "combinatorial" and "clock port" each identify a corresponding sub-rule element. In this example, the sub-rules are assumed to be related by a Boolean AND. Of course, other rule forms may be employed.

A user may enter the predefined rules through a GUI (which eventually is saved in a file with the generic format) or edit a file of the predefined rule directly (e.g., text file). Accordingly, the predefined rules for use with the design rule checking system may be constructed by the user in a predefined format (for user defined rules) or they may be "hardcoded" in the format (for pre-supported or "built in" rules not defined by the user).

Returning to FIG. 2, a block 214 depicts the rule checking engine itself. As shown, engine 214 can access the netlist with "knowledge" 210 and the predefined rules set 212 for sequentially analyzing the nodes in the netlist. In this manner, engine 214 determines whether any of the nodes violate any of the predefined rules. In so doing, the rule checking engine compares or checks all the enabled predefined rules in the predefined rules set against the extracted information of the nodes as provided within the netlist with "knowledge". Whenever during execution any one of the enabled predefined rules is violated (e.g., where all of the sub-rules of the corresponding predefined rule are fulfilled), rule checking engine 214 reports the violation. In one embodiment, engine 214 identifies the violation and appends information about the violation with the corresponding node in the atom netlist with "knowledge"; thereby, producing an atom netlist with "knowledge" and violation info as shown in block 216. In a preferred embodiment, rule checking engine 214 checks a single node by applying all of the enabled predefined rules sequentially to the node before proceeding to a different node in the netlist. In other words, when rule checking engine 214 encounters a new node, it applies each enabled predefined rule in succession. Of course, the invention is not limited to this approach. The rule checking engine could, alternatively, apply a single rule to some or all nodes before applying a different rule.

In a preferred embodiment, rule checking engine 214 is implemented as a single "generic" software routine that executes many different predefined rules on nodes in the netlist. In other words, it accepts any rule that follows a common format. Preferably, though not necessarily, engine 214 acts on information that was previously extracted from the netlist.

As explained, conventional design rule checking systems include a separate pre-coded "function" for each rule. The function typically includes code for (1) separately visiting each node of a netlist and (2) extracting required information from each node it visits. Because rule checking engines of this invention typically include code for moving between nodes and accessing relevant information from netlist nodes, the invention not only increases the efficiency of checking electronic designs but allows for a flexible and simple rule entry/modification format. The rule designer can define rules without providing or accessing code for information extraction or node traversal.

Returning to FIG. 2, a report manager 217 can generate a violation report 218 from the netlist with violation information 216. The violation report may be in any form suitable for notifying the user of the violations in the electronic design. For example, the violation report may be displayed on a monitor, outputted to a printer for printing, saved to a file on a storage device, or outputted through a speaker for listening. Typically, it will not include netlist information per se. Rather it will identify particular nodes and the types of violations they cause.

As indicated from the discussion of FIG. 2, the central component of a rule checking system is a rule checking engine. This component, which is typically implemented as software, acts on a rule set and information about design nodes. From the point of view of an expert system the rule set comprises a knowledge base used by the expert system. The information evaluated by the engine may be directly associated with a netlist. If this is the case, the rule checking system may also include a knowledge extractor as an ancillary component, which is also typically implemented as software. The other ancillary component depicted in FIG. 2 is a netlist manager.

Figure 3:
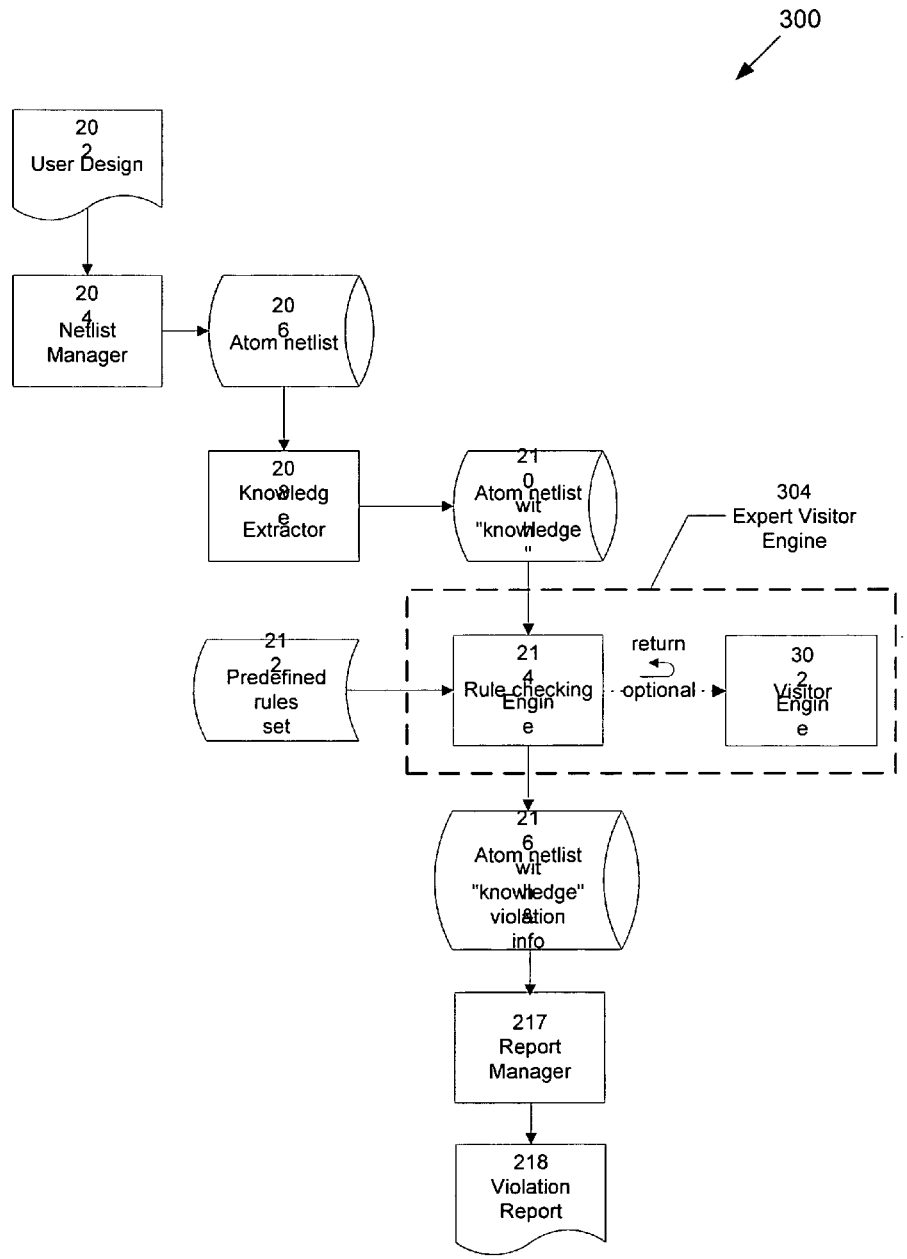
FIG. 3 illustrates a block diagram of a design rule checking system implemented as an expert traverser system according to another embodiment of the present invention.

A slightly more sophisticated example of a design rule checking system is depicted in FIG. 3. This figure explicitly shows components for handing complex rules that consider connectivity spanning multiple nodes. As shown in FIG. 3, a design rule checking system 300 is implemented as an "expert traverser" system according to another embodiment of the present invention. Basically, block diagram 300 resembles that of block diagram 200 except for the addition of a Visitor Engine (also referred to herein as a Traverser Engine) 302 that is integrated with the Rule checking engine in block 214 to form an Expert Visitor engine 304. The Visitor Engine 302 allows execution of rules requiring information derived from not just the node under consideration, but neighboring nodes as well. Furthermore, the combination of Visitor Engine 302 with the rule checking engine 214 in block 304 allows the design rule checking system to perform both simple (where information associated with neighboring nodes is not required) and complex (where information associated with neighboring nodes is required) rule checking.

Preferably, visitor engine 302, like the rule checking engine 214, is implemented as a single "generic" routine that allows some or all of the predefined rules to be applied against the nodes in the netlist. That is, the traversal routine is a general purpose routine that does not specify the logic for any particular rule or traversal mechanism. In a particularly preferred embodiment, the traversal routine is designed so that it recognizes predefined rules that require information from a neighboring node, where the neighboring node is a node not currently under consideration by the rule checking engine. In addition, the traversal routine is configured to identify the specific neighboring nodes that must be considered in order to properly evaluate a rule under consideration. Note that the traversing process can be recursively executed for a plurality of neighboring nodes or until some condition is fulfilled (e.g., with respect to a neighboring node, having a sub-rule met by any of the corresponding sub-rule elements). After determining which neighboring nodes must be considered, visitor engine 302 may further provide the rule checking engine with information about the neighboring node to allow the rule checking engine to complete its check of the node currently under consideration.

To further elaborate the traversing process of visitor engine 302, sample pseudo code is provided below for a "ripple clock" rule.

Ripple clock: —
  Current node (at level 0) is Register (reg1)

AND (Sub-rule1)
  It feeds another Register (reg2) (at level 1) clock port

AND (Sub-rule2)
  This Register (reg2) also feeds another register (reg3) (at level 2) clock port
  (Sub-rule3)

In this example, visitor engine 302 will traverse to reg2 to evaluate Sub-rule3 and thereby establish that both Sub-rule1 and Sub-rule2 are true.

Methodology for Performing Design Rule Checking

For comparison to the present invention, a conventional method of design rule checking will now be discussed. Generally, the method involves calling a plurality of rule functions in succession for executing where each rule function is self contained such that it is configured to (1) separately evaluate each node of a netlist and to (2) extract its required information from each node it visits. An example of the conventional approach can be illustrated by the following pseudo code for implementing a gated clock rule:

```
Pseudo code
Void main( )
{
   gated_clock( );         ⎫
   rule2( );               ⎬  A plurality of rule functions are
   rule3( );               ⎪  called in a sequential method to
      :                    ⎪  check the user's design
      :                    ⎭
      :
}
```

-continued

```
void Gated_Clock( )
{
   for each atom                           ⎫
   {                                       ⎪
      type = extract_atom_type(atom);      ⎪
      if (type == combinatorial)           ⎪
      {                                    ⎪
         for each atom's fanout            ⎬  One function is needed
         {                                 ⎪  for one rule. This is the
            if(fanout feed clock port)     ⎪  function to check the
            {                               ⎪  gated clock.
               gated clock rule is fired;  ⎪
               break;                      ⎪
            }                              ⎪
         }                                 ⎪
      }                                    ⎪
   }                                       ⎭
}
void rule2( )
{
   :
   :
} void rule3( )
{
   :
   :
}
```

Copyright © 2003 Altera Corporation. All Rights Reserved

As shown in the above pseudo code, the "Gated_Clock" function contains the logic for implementing the checking of a single rule—a gated clock rule. Within this function, logic for moving from node to node is specified by the code line "for each atom". Within this node (atom) loop is logic for the rule itself. As shown, it includes logic for extracting required information from each nodes that it visits. This is specified by the code "extract_atom_type(atom)". Note that the gated clock rule must know the node type to execute. The "type" information is subsequently used for evaluating the rule as expressed in the remaining logic of the function. If the type is "combinatorial" (i.e., the first sub-rule is TRUE), the Gated_Clock function then considers the node's fanout, one net at a time. Although not shown in the above pseudo code, "rule2 ( )" and "rule3 ( )" are other separate functions that contain similar logic and perform functionally in the same way as described for "void Gated_Clock ( )". Each of these functions will consider each node in succession. At each node, the functions extract any relevant information needed and then apply the rule logic.

In contrast to the previous example, an embodiment of the present invention (as depicted by the pseudo code below) employs an expert system design rule checking engine that compares a set of predefined rules against previously extracted information that is specific to a node under consideration. The engine determines whether any violation of the predefined rules has occurred, and reports the violation to the user. This process is repeated for each node of the design. This method can be illustrated by the following pseudo code implementing a gated clock rule:

```
Pseudo code:
Gated_clock:-          ⎫
    Type(combinatorial), ⎬ Predefined rule
    Fanout (clock port)  ⎭ void main( )
{
   rule_checking_engine( );
} void rule_checking_engine( )
{
   for each atom
   {
      for each rule
      }
         result = true;
         for each sub rule
         {
            result = result &&
               check_sub_rule(atom, sub_rule);
            if(!result)
               break; // no violation
         }
         if(result)
         {
            // violation rule is fired
         }
      }
   }
} bool check_sub_rule(atom, sub_rule)
{
   result = false;
   for each sub_rule_element
   {
      result = result || check_sub_rule_element(atom,
   sub_rule_element);
      if(result)
         break; // sub rule element criteria is met
   }
   return (result);
}
bool check_sub_rule_element(atom, sub_rule_element)
{
   // Match the sub rule condition with the stored related
information of atom.
```

Based on pre-defined rules, each atom will be checked. If a violation is found in a particular atom, the rule will be fired on it.

```
   // If condition fulfill, return true else return false
}
```

Copyright © 2003 Altera Corporation. All Rights Reserved

Note that the sub-rule can be defined in a more complicated way such as using an OR operator as illustrated here:

Rule 1:-
    (Sub-rule element 1) OR (Sub-rule element 2),} 
    Sub-rule 2.

——Sub rule 1

Thus, the bool check_sub_rule_element(atom, sub_rule_element) routine is constructed to loop over each available sub-rule element ("for each sub_rule_element).

In the above pseudo code, the rule engine is constructed as a set of nested loops. At the outer level, a loop denoted by the "for each atom" code line considers each node in succession. At any given node (iteration), a generic routine for executing each of a series of rules in succession is depicted by the "for each rule" code line. These rules are the rules of the pre-defined rule set. As shown, an inner routine denoted by "for each sub rule", evaluates each sub-rule of the rule under consideration. The result of a sub-rule is initially set to be true. If all sub-rules are found to be false, then there is no violation of the rule. Each sub-rule is evaluated by executing "check_sub_rule" routine, which in turn calls a "check_sub_rule_element" routine once for each sub-rule element of the sub-rule in question.

Alternately, the present invention can employ a traversing design rule checking engine that compares at every node a set of predefined rules against a set of already extracted information that is specific to every node, and, in addition, traverses to neighboring nodes if information from the neighboring nodes is required, identifies whether any violation of the predefined rules has occurred, and reports the violation to the user. An example of this design rule checking engine is illustrated by the following pseudo code implementing a gated clock rule:

```
void rule_checking_engine( )
{
    for each atom
    {
        for each rule
        {
            result = true;
            for each sub rule
            {
                result = result &&
                    check_sub_rule (atom, sub_rule);
                if (!result)
                    break; // no violation
            }
            if (result)
            {
                // violation rule is fired
            }
        }
    }
}
```

Based on predefined rules, each atom will be checked. If a violation is found in a particular atom, the rule will be fired on it.

-continued

```
bool check_sub_rule (atom, sub_rule)
{
    result = false;
    if (sub_rule.depth < 0)
    {
        for each atom fanin
        {
            sub_rule.fanin--;
            result = result ||
                check_sub_rule (fanin, sub_rule);
        }
    }
    if (sub_rule.depth > 0)
    {
        for each atom fanout
        {
            sub_rule.fanout--;
            result = result ||
                check_sub_rule(fanout, sub_rule);
        }
    }
    for each sub_rule_element
    {
        result = result ||
            check_sub_rule_element (atom,
            sub_rule_element);
        if (result) break;
    }
    return (result);
}
bool check_sub_rule_element(atom, sub_rule_element)
{
    // Match the sub rule condition with the stored related
information of atom.
    // If condition fulfill, return true else return false
}
```

Traverser Engine for traversing fan-in or fan-out if necessary. In so doing, it checks the sub-rule of the predefined rule.

Copyright © 2003 Altera Corporation. All Rights Reserved

Although there are many similarities between this rule engine and the one presented immediately before, one difference is the presence of traverser engine code. The traverser engine provides the capability of visiting neighboring nodes if necessary. This capability is triggered by the "if(sub_rule.depth <0)" and the "if(sub_rule.depth >0)" checks. The node under consideration is deemed to be the "0" node. If information is required from a fanin node to the node currently under consideration, then the "if(sub rule.depth <0)" check causes traversal to each node feeding 0 node. Each of these nodes then becomes the "0" node while the traverser engine considers it. If the rule under consideration requires knowledge of nodes that are even further upstream, the "if(sub_rule.depth <0)" will determine this and require further traversal to the set fanin nodes feeding the current node under consideration. This continues until the traverser engine determines that the rule in question has obtained all levels of fanin information required. The number of levels to be traversed may be specified by various means. In one approach, the engine simply checks the rule at each level of traversal to determine whether any further information is required from neighboring nodes. When all required information has been obtained, the traversing ends. In another approach, the traversal depth depends on a "depth" specified in the rule, sub-rule, or sub-rule element (e.g., Rule.depth, sub_rule.depth, sub_rule_element.depth). In the case of the above described "ripple clock" rule, for example, two levels of traversal are required to obtain all information needed to execute the rule.

A similar approach is employed for rules that require fanout information. In this case the "if(sub_rule.depth >0)" check controls downstream traversal required to collect the needed information.

Figure 4:
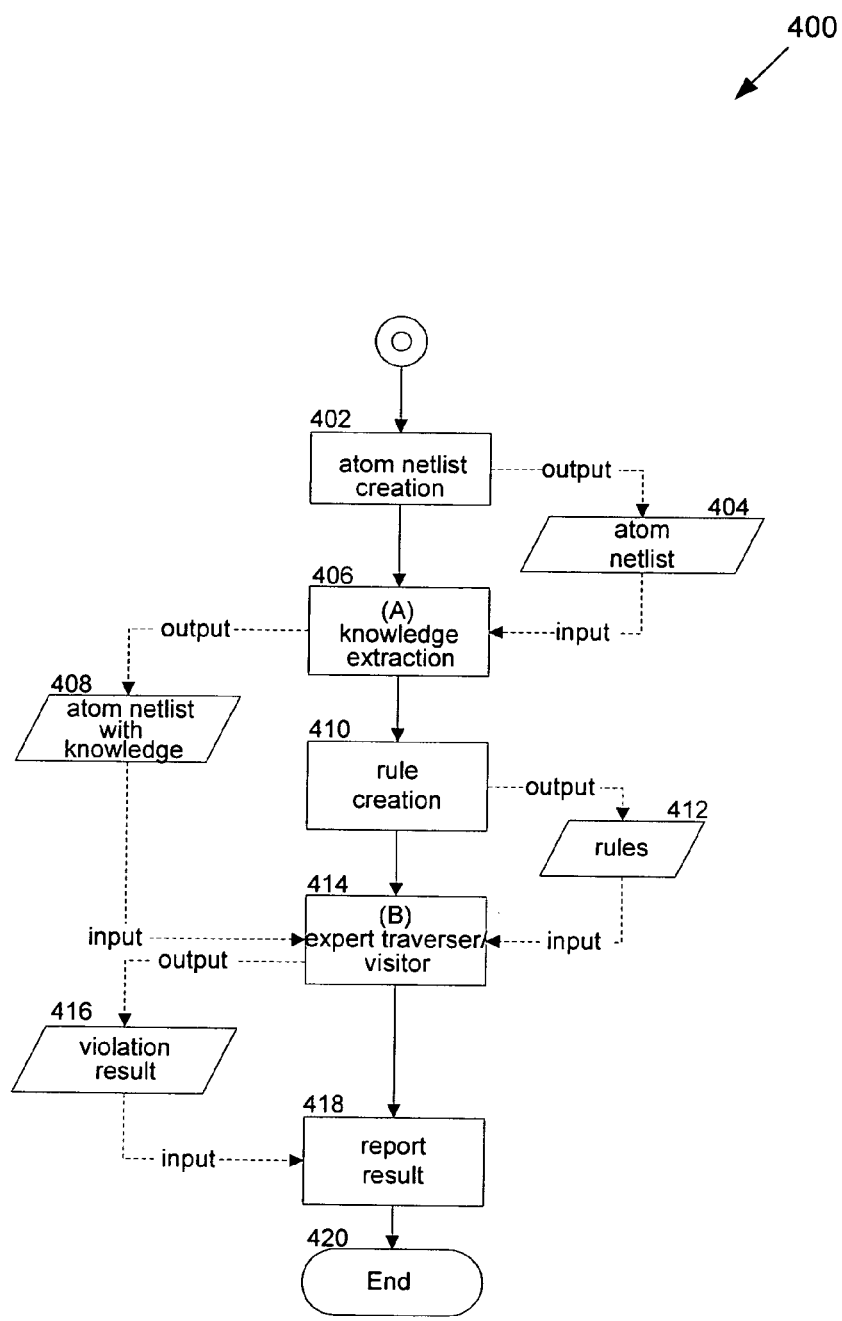
FIG. 4 illustrates a flowchart of a design rule checking system implemented as an expert traverser system according to one embodiment of the present invention.

In order to further describe some methods embodied in the present invention, FIGS. 4-6 will now be discussed. FIG. 4 presents a high level flowchart of a general method 400 employed by a design rule checking system having traverser capability according to one embodiment of the present invention. The method 400 begins at a block 402 where the EDA system creates and outputs an atom netlist 404. This may be done using any tool or mechanism that can create netlists from high level representations of electronic designs. In FIGS. 2 and 3, the netlist creator is identified as a Netlist Manager.

Next, as illustrated in a block 406, the atom netlist 404 is provided as input for a "knowledge extraction" operation. As indicated, "knowledge" (properties, features, etc. relevant to design rules) is extracted from the netlist and made available for the design rule engine. For this purpose, knowledge extraction operation 406 creates and outputs an atom netlist with knowledge 408. This may take many different forms. As explained above, it is convenient to directly associate the "knowledge" extracted from each node with its corresponding node. Exemplary details of operation 406 are presented in a flow chart depicted in FIG. 5.

As illustrated, the design rule checking system provides a rule creation operation 410. This is shown as taking place after knowledge extraction operation 406, but it could take place at any point in the process. It is not necessarily tied to the process of knowledge extraction. As explained above, the rules used can be provided as "hard coded" rules that come with the design rule checking system and/or user created or selected rules. Rule creation may include steps of preparing, entering, editing, loading, selecting, setting, and/or enabling a set of rules for use in validating the electronic design. As shown, rule creation operation 410 outputs a set of rules 412.

Once the predefined rules are created or otherwise made available, rule checking is performed with an "expert traverser/visitor" engine as depicted in block 414. As previously explained, the expert traverser/visitor engine is designed or configured to compare the rule set 412 against the extracted information contained in the atom netlist with knowledge 408. In method 400, rule set 412 and netlist 408 are provided as inputs to the expert traverser/visitor operation 414. As its name suggests, the traverser operation can traverse neighboring nodes if information from the neighboring nodes is required to execute a particular rule from rule set 412.

Figure 6:
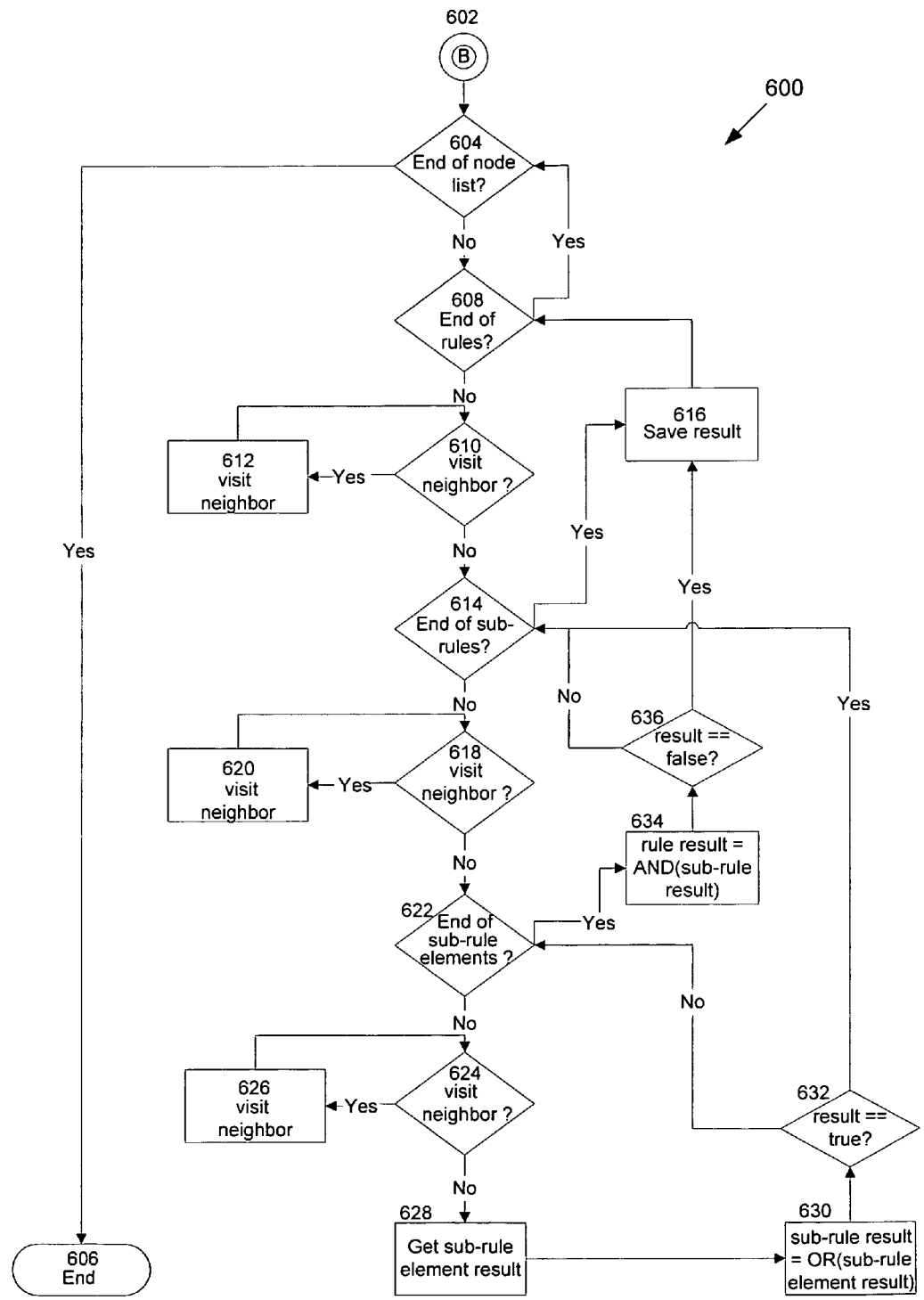
FIG. 6 illustrates a flowchart of the expert traverser/visitor step according to one embodiment of the present invention.

As FIG. 6 illustrates in detail, operation 414 may be performed in a manner allowing each rule from rule set 412 to be executed on each node of netlist 404/408. Regardless of how the operation is 414 is performed, a goal is to determine whether any violation of the predefined rules has occurred, and generate a violation result 416.

After the expert system traverser operation, method 400 reports the result at an operation 418. This may involve displaying or otherwise communicating a list of violations (if any) to the user. The result may be presented in the form of a report, etc. Method 400 ends as indicated at block 420.

Figure 5:
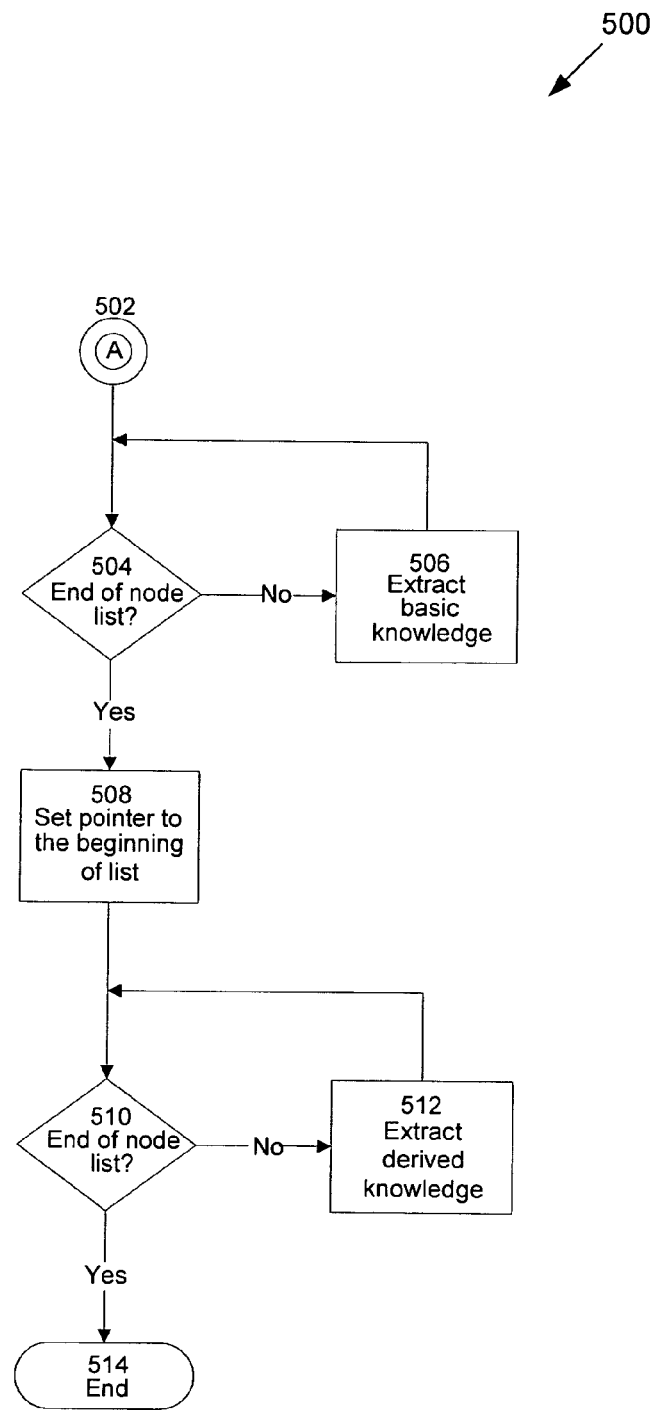
FIG. 5 illustrates a flowchart of the knowledge extraction step according to one embodiment of the present invention.

FIG. 5 presents a flowchart of a method 500 for the knowledge extraction operation 406 according to one embodiment of the present invention. From entry point A (labeled as 502), method 500 proceeds to a decision block 504, where the extraction tool determines whether the last node in the netlist has been reached. This decision controls a loop over the nodes in netlist 404. Basically, the process considers each node in succession until the last node is reached. At that point, decision 504 is answered in the affirmative. Until that point (i.e., the end of the nodes in the netlist has not been reached), a process of extracting "basic knowledge" is performed at block 506. This operation is performed for the node under consideration. Basic knowledge comprises of the basic attributes such as node type, total fanin, total fanout, atom ID, and other information that can be obtained by simple inspection of the node under consideration. It does not include information that must be deduced or inferred from other information. Nor does it include information that must be obtained from neighboring nodes. Rather, it is provided in or is immediately apparent from the nodes and nets of the netlist.

After the basic knowledge has been extracted from a given node, the engine moves the next node on the netlist, unless the end node has been reached. At the next node, it extracts the basic knowledge of that node.

When all nodes have been considered, decision operation 504 is answered in the affirmative and process control transfers to a block 508, which directs operation to the first node in the netlist by, for example, setting a pointer to the beginning of the list. Thereafter, a decision operation 510 determines whether the end node in the netlist has been reached. Like decision 504, decision 510 controls a loop over all nodes of netlist 404, with one iteration for each node. So long as decision 510 is answered in the negative (i.e., the end node has not been reached), a process of extracting derived knowledge is performed in an operation 512: once for each node in succession. Derived knowledge includes attributes that are derived from the basic knowledge or from particular pieces of basic knowledge and/or constructed from one or more pieces of basic knowledge. Generally, the derived knowledge is not immediately apparent from inspection of the node in question, and must be inferred. In addition, some derived knowledge may be obtained from immediately neighboring nodes.

An example of derived knowledge is FANOUT_NODE_TYPE, which includes all the node types that the current node under extraction feeds to. Assuming that node (or atom) A will feed to 2 nodes named node B and node C respectively, such as A→B (where B is a register) and A→C (where C is a AND gate), FANOUT_NODE_TYPE will then be (REG|AND) type. When represented as integers, FANOUT_NODE_TYPE=0x00003 while REG=0x00001 and AND=0x00002. Here, FANOUT NODE TYPE is considered derived knowledge since its associated attributes may not yet been made available by the extraction for basic knowledge operation in block 506. That is, due to the possibility that node B type and node C type may not yet be known at the time the current node A is extracted for basic knowledge, FANOUT_NODE_TYPE must be extracted as derived knowledge in block 512 after extraction for basic knowledge in block 506 has been performed for all the nodes.

When the end node in the netlist has been reached at 510, the method 500 concludes as indicated at 514. The basic and derived knowledge obtained during method 500 is made available for the design rule checking engine.

FIG. 6 depicts a method 600 corresponding to the expert traverser/visitor operation 414 from FIG. 4 according to one embodiment of the present invention. Specifically, FIG. 6 presents the core operation of an expert system design rule checking engine according to this embodiment.

Entry to method 600 as depicted at point B (602) begins with a decision operation 604, which determines whether the end of the node list has been reached. This operation controls a process loop over the individual nodes of the netlist 404. When the end of the node list is reached, method 600 ends as indicated at 606. But before the end of the node list is detected at 604, process control cycles through a decision block 608, which determines whether the end of rule set 412 has been reached. Thus, decision 608 controls a loop over each rule in the rule set. If decision block 608 detects that the end of the rule list has been reached, the rule engine exits the rule loop and returns to the node loop by directing process control to operation 604.

Assuming that rules remain to be considered for the node under consideration, decision 608 directs process control to a decision 610, which determines whether visiting a neighboring node is required in order to execute the rule in question. The determination may be implemented with any suitable check such as when "depth !=0". Please note that the visitation may be applied to a whole rule (e.g., rule1.depth=1) or to a rule that is part of a sub-rule element (e.g., Basic-rule: —Rule). If decision 610 determines that visiting the neighboring node is required, a routine 612 performs the visitation. Thereafter, process control returns to decision block 610, which determines again whether to visit a neighboring node. Generally, the loop between block 610 and visitation routine 612 allows the ability to shift focus from the current node to its neighboring node for further checking as necessary. For example, assume the "rule1.depth=2", node A is the current node, and the netlist is as follows:

```
A -> B -> C
  -> D -> E
       -> F
  -> G -> H
```

In this example, a loop will be performed through all of node A's fanout (i.e., B, D and G) (depth is 1) and will eventually reach nodes C, E, F and H (depth is 2) respectively. For every node at depth 2 (i.e., node C, E, F and H), rule1 will be applied on them. However, if it is determined that no further visits to a neighboring node are required (e.g., "depth=0"), process control is directed to another decision block. Decision block 614 determines whether the end of the sub-rules associated with a rule been reached. Note that, in this embodiment, a rule includes one or more sub-rules. Thus, decision block 614 controls a loop over the individual sub-rules of a particular rule under consideration. Note also that a general form of a rule includes one or more sub-rules linked by an AND.

If decision 614 determines that the last of the sub-rules has been considered, it directs process control to an operation block 616, where the cumulative results of the current rule are saved. In a typical example, these results include information at the nodes considered and whether individual nodes exhibited violations or no violations of the rule in question. After the results have been saved, the process returns to decision block 608, where the rule list is incremented to the next rule—assuming that the end of the rules list has not been reached.

If decision 614 determines that the end of the sub-rules has not been reached, it directs process control to a decision 618, which determines—for the sub-rule under consideration— whether a neighboring node should be visited. This might be the case when, for example, "depth !=0". If visiting the neighboring node is required, a routine 620 causes visitation to the neighboring node specified in the sub-rule. There, the rule engine applies the sub-rule on the neighboring node. When this is complete, process control returns to decision 618, which again determines whether to visit a different neighboring node (e.g., how many levels of fan-in/fan-out to be traversed/visited). This would be appropriate when, for example, the executing sub-rule constrains multiple levels of separation from the node under consideration or when the input or output of the node under consideration has multiple nets (fanin or fanout).

Assuming that decision operation 618 determines that no further visits are required for the sub-rule under consideration, it directs the method to a decision operation 622, which determines whether the end of the sub-rule elements (for the current rule) has been reached. This is yet another loop control block—this time for controlling looping over sub-rule elements of a given sub-rule. As indicated above, a typical rule includes one or more sub-rules connected by an "AND". Each sub-rule includes one or more sub-rule elements connected by an "OR".

If decision block 622 determines that additional sub-rule element remain to be considered, it directs the process to a decision block 624, which determines whether the current sub-rule element requires a visit to a neighboring node. As long as more neighboring nodes must be visited for the rule under question, a visitation takes place at block 626, where information necessary to execute the sub-rule element in question is retrieved. Note that in each of the loops for sub-rule elements, sub-rules, and rules, the node in question (as controlled by decision 604) may itself have information necessary to evaluate sub-rule element, sub-rule or rule in question. To this end, the loops implicitly include an evaluation of that information and a determination of whether a rule is violated.

In a preferred embodiment, the loops mentioned earlier between 610 and 612, 618 and 620, as well as 624 and 626 are similar in function and execution except for the fact that they are performed at different levels of the rule. That is, the loops may be performed at the rule, sub-rule, or sub-rule element level.

When decision 622 determines that last sub-rule element has been considered, it directs process control to a block 634, which sets a "rule result" to the Boolean AND of all sub-rule results obtained so far for the rule under consideration. From block 634, process control moves to a decision block 636, which determines whether the rule result is false. If so, operation 616 is performed; i.e., the result (false) is saved. This means that no violation will has occurred for the rule in question because at least one sub-rule has not been met (i.e., it is FALSE). To this end, evaluation of the current rule terminates and process control moves to decision 608, where the rule list is incremented if possible. If, on the other hand, the result at block 634 is not FALSE, it is still possible that the rule could be violated. Thus, process control returns to 614, where the engine determines whether any sub-rules remain to be considered. From there, the process continues as described above.

Referring again to the sub-rule element loop defined by blocks 622, 624, and 626, if the end of the sub-rules elements has not been reached, and no further neighbors remain to be visited (i.e., decision 624 is answered in the negative), process control is directed to a block 628. There the rule engine obtains the result for the sub-rule under consideration. After receiving the sub-rule element result, a process block 630 sets the sub-rule result to the Boolean OR of all sub-rule element results obtained so far for the sub-rule under consideration. From there, a decision block 632 determines whether the sub-rule result is true. If the sub-rule result is true, then the sub-rule under consideration is considered to have been met and no further evaluation of sub-rule elements is required. Hence, process control is directed to decision block 614, which determines whether any other sub-rules remain to be considered. Otherwise, process control is directed to decision block 622 which determines whether any sub-rule elements remain to be considered for the sub-rule under consideration. Further evaluation of sub-rule elements could find that one of those elements is met, which means that the sub-rule under consideration is TRUE.

It is important to note that any of the steps in the methods embodied in the present invention can either be automated or require user intervention. For example, the setting of the predefined rule set at block 410 may either (1) be automated where a default set of predefined rules is automatically set by a program for validating the electronic design or (2) be manually set by the user. Furthermore, the steps may be arranged differently in sequence as will be apparent to one skilled in the art.

Application

While the methods, apparatus, and computer program products of this invention are applicable to any electronic design, they find particular value in the context of programmable logic devices (PLDs). As mentioned, a PLD is a programmable integrated circuit that allows the user of the circuit, using software control, to customize the logic functions the circuit will perform. Examples of PLDs are FPGAs (Field Programmable Gate Arrays) and EPLDs (Erasable Programmable Logic Devices). The logic functions previously performed by small, medium and large-scale integration integrated circuits can instead be performed by programmable logic devices. As indicated, programmable logic devices supplied by integrated circuit manufacturers like Altera Corporation (a more detailed description of these products can be found at "www.altera.com") are not inherently capable of performing any specific function. The user, in conjunction with software supplied by the PLD manufacturer, can program the PLD to perform the specific function or functions required by the user's application. The PLD then can function in a larger system designed by the user, just as though dedicated logic chips were employed.

A typical PLD includes an array of logic cells that can be individually programmed and arbitrarily interconnected to each other to provide internal input and output signals, thus permitting the performance of complex combinational and sequential logic functions. The program is implemented in the PLD by setting the states of programmable elements such as memory cells. These memory cells may be implemented with volatile memories, such as SRAMs, which lose their programmed states upon termination of power to the system. If the programmable elements used are volatile memories, the memory cells must be configured upon each system power-up in order to configure the PLD.

In addition to methods, apparatus, and computer program products, this invention also relates to programmable logic devices (and other target hardware devices, including non-programmable devices including ASICs and even general purpose integrated circuits) programmed with a design prepared in accordance with the above-described methods.

The foregoing describes the instant invention and its presently preferred embodiments. Numerous modifications and variations in the practice of this invention are expected to occur to those skilled in the art. For instance, the techniques and systems of the present invention are suitable for use with a wide variety of EDA tools and methodologies for designing, simulating, compiling and/or programming a device. Therefore, the described embodiments should be taken as illustrative and not restrictive, and the invention should not be limited to the details given herein but should be defined by the following claims and their full scope of equivalents.

What is claimed is:

1. A method of performing design rule checking on a netlist representation of an electronic design using an electronic design automation (EDA) computer system, the method comprising:
   (a) receiving a plurality of design rules specifying constraints on the properties of particular nodes in a netlist, wherein each rule specifies a logical combination of constraints on properties of particular nodes in the netlist, without including functionality for extracting said properties from the netlist;
   (b) at a first node of the netlist, employing a generic routine to execute a first design rule from the plurality of design rules and determine whether properties of the first node violate the first design rule; and
   (c) at the first node of the netlist, employing the generic routine to execute a second design rule from the plurality of design rules and determine whether properties of the first node violate the second design rule,
   wherein the generic routine is operable to execute a plurality of different design rules that follow a format generic to the rules, said format including a rule name and at least one a sub-rule and at least one a sub-rule element.

2. A method as recited in claim 1, further comprising: extracting properties from the netlist and making them available for execution of the first and second design rules in (b) and (c).

3. A method as recited in claim 1, further comprising: using the generic routine to execute a plurality of additional design rules at the first node.

4. A method as recited in claim 1, further comprising: using the generic routine to execute the first design rule at a second node.

5. A method as recited in claim 1, further comprising: using the generic routine to execute all design rules at first node, then using the generic routine to execute all design rules at a second node.

6. A method as recited in claim 1, further comprising: using the generic routine to execute all design rules at each node of a plurality of other nodes.

7. A method as recited in claim 6, further comprising: traversing to a neighboring node when any of the design rules require extracted properties from a neighboring node.

8. A method as recited in claim 1, wherein the extracted properties is selected from the group consisting of fanin count, fanout count, atom type, and port source atom type.

9. A method as recited in claim 1, wherein the plurality of design rules is selected from the group consisting of electrical rules, connectivity rules, clock rules, timing closure rules, reset rules, and signal race rules.

10. A method as recited in claim 1, wherein employing the generic routine comprises:
   employing a logical operator for checking a plurality of sub-rules, the plurality of sub-rules being part of a corresponding design rule within the plurality of design rules.

11. A method as recited in claim 10, wherein the logical operator is selected from the group consisting of AND, NAND, NOR, XOR, and OR.

12. A computer program product comprising a machine executable program stored in a computer readable storage device on which is provided program instructions for performing design rule checking on a netlist representation of an electronic design, the program instructions executable by a computer comprising:
   (a) instructions for receiving a plurality of design rules specifying constraints on the properties of particular nodes in a netlist, wherein each rule specifies a logical combination of constraints on properties of particular nodes in the netlist, without including functionality for extracting said properties from the netlist;
   (b) instructions for employing a generic routine, at a first node of the netlist, to execute a first design rule from the plurality of design rules and determine whether properties of the first node violate the first design rule; and
   (c) instructions for employing the generic routine, at the first node of the netlist, to execute a second design rule from the plurality of design rules and determine whether properties of the first node violate the second design rule
   wherein the generic routine is operable to execute a plurality of different design rules that follow a format generic to the rules, said format including a rule name and at least one a sub-rule and at least one a sub-rule element.

13. A computer program product as recited in claim 12, wherein the program instructions further comprises:
   instructions for extracting properties from the netlist and making them available for execution of the first and second design rules in (b) and (c).

14. A computer program product as recited in claim 12, wherein the program instructions further comprises:
   instructions for using the generic routine to execute a plurality of additional design rules at the first node.

15. A computer program product as recited in claim 12, wherein the program instructions further comprises:
   instructions for traversing to a neighboring node when the first design rule requires extracted properties from a neighboring node.

* * * * *